United States Patent
Chung et al.

(10) Patent No.: US 9,190,239 B2
(45) Date of Patent: Nov. 17, 2015

(54) PLASMA IMMERSION ION MILLING APPARATUS AND METHOD

(75) Inventors: Sung Il Chung, Gyeongsangnam-do (KR); Hyeon Seok Oh, Gyeonggi-do (KR); S. A. Nikiforov, Gyeongsangnam-do (KR); Pan Kyeom Kim, Gyeongsangnam-do (KR); Hyeon Taeg Kim, Gyeongsangnam-do (KR); Jeong Woo Jeon, Gyeongsangnam-do (KR); Jong Moon Kim, Daegu (KR)

(73) Assignee: Korea Electrotechnology Research Institute, Gyeongsangnam-Do (KR)

( * ) Notice: Subject to any disclaimer, the term of this patent is extended or adjusted under 35 U.S.C. 154(b) by 215 days.

(21) Appl. No.: 13/265,051
(22) PCT Filed: Oct. 27, 2010
(86) PCT No.: PCT/KR2010/007418
§ 371 (c)(1), (2), (4) Date: Oct. 18, 2011
(87) PCT Pub. No.: WO2011/065669
PCT Pub. Date: Jun. 3, 2011

(65) Prior Publication Data
US 2012/0222952 A1 Sep. 6, 2012

(30) Foreign Application Priority Data
Nov. 24, 2009 (KR) .................. 10-2009-0113633

(51) Int. Cl.
*C23C 14/34* (2006.01)
*H01J 37/08* (2006.01)
(Continued)

(52) U.S. Cl.
CPC ................ *H01J 37/08* (2013.01); *C23C 14/48* (2013.01); *H01J 37/305* (2013.01); *H01J 37/32009* (2013.01)

(58) Field of Classification Search
CPC .. C23C 14/48; H01J 37/32009; H01J 37/305; H01J 37/08

USPC .......... 204/192.32, 192, 34, 298, 31, 298.34; 118/723
See application file for complete search history.

(56) References Cited

U.S. PATENT DOCUMENTS 4,298,443 A * 11/1981 Maydan ................... 204/192.32
4,511,593 A * 4/1985 Brandolf ...................... 427/562
(Continued)

FOREIGN PATENT DOCUMENTS

JP   61076668 A  *  4/1986
JP   10-188873 A     7/1998
(Continued)

*Primary Examiner* — John Brayton
(74) *Attorney, Agent, or Firm* — Frommer Lawrence & Haug LLP (57) ABSTRACT

Disclosed is an apparatus and method for low-temperature plasma immersion processing of a variety of workpieces using accelerated ions, wherein low-temperature plasma is distributed around a cylindrical workpiece placed in a chamber, the workpiece is enclosed with a housing including a multi-slot extracting electrode to isolate the workpiece from plasma, and a negative potential sufficient to induce sputtering is applied to the workpiece and the electrode, so that ions from plasma are accelerated within the sheath formed between the extracting electrode and plasma, pass through the slot part of the electrode and bombard the workpiece, thus polishing the surface of the workpiece. This apparatus and method is effective for surface smoothing to ones of nm of large cylindrical substrates particularly substrates for micro or nanopattern transfer. This method includes plasma cleaning, surface activating, surface smoothing, dry etching, deposition, plasma immersion ion implantation and deposition within a single or multi chamber.

10 Claims, 12 Drawing Sheets

(51) Int. Cl.
 *C23C 14/48* (2006.01)
 *H01J 37/305* (2006.01)
 *H01J 37/32* (2006.01)

(56) References Cited

U.S. PATENT DOCUMENTS 4,950,376 A * 8/1990 Hayashi et al. .......... 204/192.32
5,276,386 A * 1/1994 Watanabe et al. ........ 315/111.21
5,279,669 A * 1/1994 Lee ........................ 118/723 MR

FOREIGN PATENT DOCUMENTS

| | | |
|---|---|---|
| JP | 2001-266785 | 9/2001 |
| JP | 2008-204905 A | 9/2008 |
| KR | 10-2008-0072355 A | 8/2008 |

* cited by examiner

ION RADIATION DIRECTION UPON ROTATION
FROM POSITION 1 TO POSITION 2

ION RADIATION DIRECTION UPON ROTATION
FROM POSITION 1 TO POSITION 2

PLASMA IMMERSION ION MILLING APPARATUS AND METHOD

This application is a 371 of PCT/KR2010/007418 filed on Oct. 27, 2010 published on Jun. 3, 2011 under publication number WO 2011/065669 A which claims priority benefits to Korean Patent Application Number 10-2009-00113633 filed Nov. 24, 2009, the disclosure of which is incorporated herein by reference.

TECHNICAL FIELD

The present invention relates to a plasma immersion ion milling apparatus and method, and more particularly to an apparatus and method for low-temperature plasma immersion processing of a variety of workpieces using accelerated ions.

BACKGROUND ART

Surface treatment with energetic ions is essential in semiconductor processing, MEMS and MEMS manufacturing, pattern transfer technologies, hard coatings, etc.

Ion bombardment is employed in a variety of fields including cleaning, activating the surface of a substrate, modifying wettability, enhancing hardness, depositing various films, doping semiconductors by ion implantation, etc.

Typically, all ion processing techniques may be classified into the following two types.

The first type is one wherein an ion beam is extracted from an ion source and radiated onto a substrate placed at a predetermined distance away from it in a vacuum chamber.

This type separately or simultaneously transports the ion beam and the substrate in order to attain desired results.

As such, the ion charge may be neutralized by an auxiliary electron emitter.

Examples of the corresponding techniques include ion beam assisted deposition, ion beam etching or milling, and ion beam implantation.

The second type provides an apparatus wherein a workpiece is placed in a plasma atmosphere and electrically biased to a predetermined negative potential.

As such, ions are accelerated within the sheath formed in the front of the workpiece. To this end, DC, RF, and pulsed bias may be used.

This technique category includes PVD, PECVD, PI3D, RIE and so on.

Meanwhile, ion etching, also called ion milling, is important varieties of ion processing.

This is based on surface sputtering by energetic ions.

Figure 1:
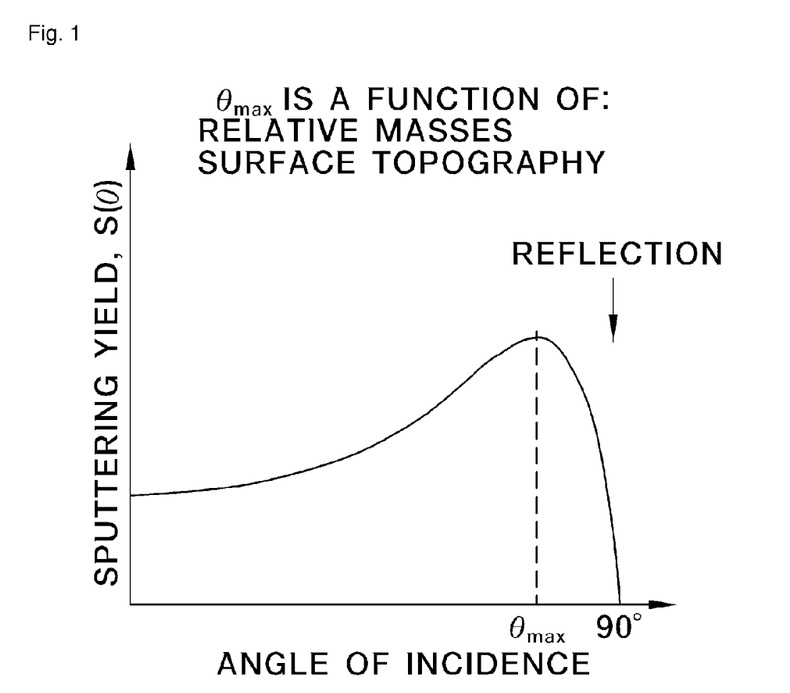
FIG. 1 is a graph showing dependence of sputtering rate by accelerated ions on the angle of incidence.

The important feature of ion sputtering is the nonlinear dependence of the sputtering rate on the angle of incidence of the ions, as shown qualitatively in FIG. 1.

Furthermore, ion sputtering may be applied to both physical and reactive processes.

The numerous applications of ion milling include semiconductor processing, formation of nanostructures, surface texturing, and surface smoothing.

Ion beam processing, corresponding to an advanced emerged technique, is used as a final step in the manufacturing of optical components.

Surface smoothing applications include reducing the micro-roughness on critical interfaces for optical components and high-power devices, or sample preparation in SIMS and TEM.

Typically plasma milling using normal ion incidence is uniformly carried out in a direction perpendicular to a substrate and is thus adapted for etching to form a pattern, and is not suitable for surface polishing that selectively removes protruding portions to reduce surface roughness.

Figure 2:
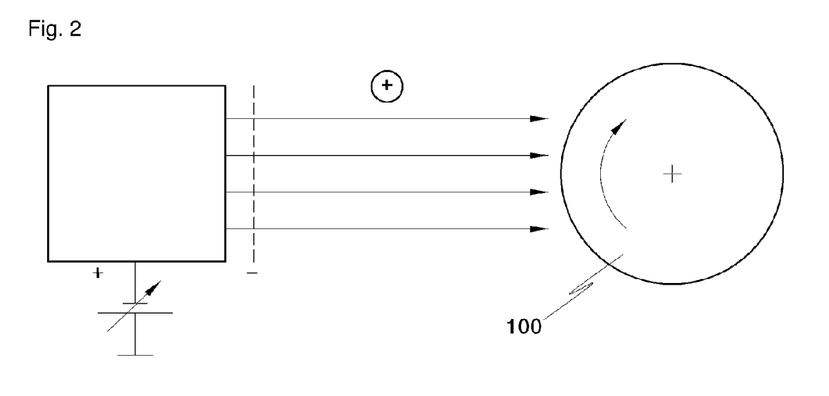
FIG. 2 is a schematic view showing ion beam etching of a cylindrical workpiece.
Figure 3:
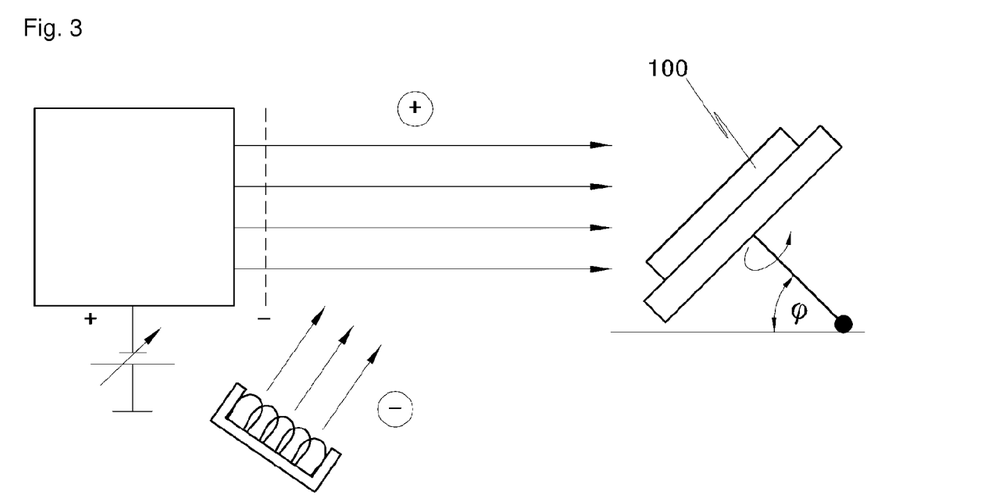
FIG. 3 is a schematic view showing ion beam etching of a planar workpiece.

In order to solve such problems, substrate tilting or rotating is commonly used in plasma milling that uses normal ion incidence (FIGS. 2 and 3).

For example, FIG. 2 shows the ion beam etching of a cylindrical workpiece, in which a ribbon ion beam travels from a linear ion source into a vacuum chamber along the axis of a workpiece 100 that is rotating.

FIG. 3 shows the ion beam etching of a planar workpiece.

As such, a circular ion beam emitted from an ion source is directed onto a workpiece 100 that is rotating in a state of being tilted at a predetermined angle in the vacuum chamber.

As seen in the drawing, an electronic gun functions to neutralize the charged ions.

Examples of commercial ion milling machines include Model 691 Precision Ion Polishing System available from Gatan Inc., Model 1010 Ion Mill available from Fischione Instr., and IonScan 800 Polishing Fault Correction System available from Roth & Rau AG.

Forming a pattern on the nanometer scale requires surface polishing to ones of nm or less.

Chemical mechanical polishing (CMP) is mainly utilized for polishing planar Si wafers in the semiconductor industry.

However, CMP cannot be applied to 3D substrates.

Applications requiring 3D substrates include for example photoreceptor drums used in electrophotographic machines.

Technologies which are recently received attention, like nano pattern transfer, may have many advantageous using 3D substrates, in particular, cylindrical substrates.

Large cylindrical nanostampers resulting from such substrates may be utilized as a key component of next-generation displays.

However, machines able to polish the large cylindrical workpiece to the desired level have not yet been introduced.

The ribbon ion beam emitted from a linear ion source may be applied to surface smoothing of a large workpiece. However, the productivity of this method is limited.

Using two or more ion sources simultaneously is devised but is problematic because the system becomes complicated, the machine price may increase, and respective components are less reliable because of interference between the ion sources.

SUMMARY OF INVENTION

Technical Problem

Accordingly, the present invention has been made keeping in mind the problems encountered in the related art and the present invention is intended to provide a plasma immersion ion milling apparatus and method, in which a chamber in a plasma atmosphere, a workpiece housing that isolates a workpiece from plasma, an element for applying a negative potential to the workpiece and the housing, and an element for rotating the workpiece are included, so that ions accelerated within a sheath formed around the workpiece housing are immersed and bombard the workpiece that is rotating, thereby efficiently achieving surface smoothing of a large cylindrical workpiece.

Solution to Problem

An aspect of the present invention provides a plasma immersion ion milling apparatus, comprising a vacuum chamber which is electrically insulated and in which plasma is distributed, a rotary support on which a workpiece is placed which is disposed in the vacuum chamber, a rotating element which is disposed in the vacuum chamber to rotate the rotary support, a housing including a slot part disposed along a surface of a workpiece on at least one side thereof, being conductive, enclosing the workpiece to isolate the workpiece from plasma and electrically connected to the workpiece, and a power source for supplying power to the workpiece and the housing.

Another aspect of the present invention provides a plasma immersion ion milling method, comprising disposing, in an electrically insulated chamber, a workpiece on a rotary support electrically insulated from the chamber, enclosing the workpiece with a housing which is electrically connected to the workpiece and functions as an ion extracting electrode with a slot part, forming plasma in the chamber, applying a negative bias to the workpiece and the housing and rotating the workpiece, and extracting ions, which were accelerated within a sheath formed around the housing, into a space between the workpiece and the housing through the extracting electrode so that the ions bombard the workpiece, thus polishing the surface of the workpiece.

Advantageous Effects of Invention

According to the present invention, a plasma immersion ion milling apparatus and process enables the surface of a large cylindrical substrate, in particular, a substrate for micro or nano pattern transfer to be processed to have a surface roughness of ones of nm.

Also, according to the present invention, plasma cleaning, surface activating, surface smoothing, dry etching, deposition, plasma immersion ion implantation and deposition, etc., can be efficiently performed in a single or multi chamber.

Also, according to the present invention, the plasma immersion ion milling apparatus and method can be usefully applied to micro and nano stampers for pattern transfer, photoreceptor drums of image transfer machines, 3D semiconductor devices, etc.

Therefore, the plasma immersion ion milling apparatus and method according to the present invention are advantageous because of a simple design and low maintenance cost, such that a large cylindrical substrate or planar substrate can have a surface roughness of ones of nm.

MODE FOR THE INVENTION

Hereinafter, a detailed description will be given of the present invention while making reference to the appended drawings.

According to the present invention, a plasma immersion ion milling apparatus, which is adapted for surface smoothing of a large workpiece, for example, a cylindrical workpiece, comprises a vacuum chamber 10 which is electrically insulated and in which plasma is uniformly distributed around a housing, a rotary support 12 on which a cylindrical or disk workpiece 11 is placed and which is disposed in the vacuum chamber 10, a rotating element 13 which is disposed in the vacuum chamber 10 to rotate the rotary support, a housing 15 which includes a slot part 14 disposed along the surface of the workpiece on at least one side thereof and is conductive and also which encloses the workpiece 11 so as to isolate the workpiece 11 from plasma and is electrically connected to the workpiece 11, and a power source 16 for supplying power to the workpiece 11 and the housing 15.

The housing 15 may have any cross-sectional shape, for example, a rectangular or triangular shape. A bias applied to the housing 15 and the workpiece 11 may be an RF self bias, a unipolar repetitive pulsed bias, or a bipolar repetitive pulsed bias so that an accumulated positive charge is compensated for by a negative one every pulse. Also, an interior antenna ICP source, an inert gas such as argon, or a reactive gas may be used to form plasma in the vacuum chamber 10.

The support 12 provided to place the workpiece 11 thereon may include a bearing member, and the rotating element 13 used to rotate the workpiece 11 may include a typical rotator having a motor as a driving source.

The vacuum chamber 10 includes a pump 17 for ensuring that there is a strong vacuum in the chamber, and a gas shower 18 which sprays gas along the housing 15.

The cylindrical workpiece 11 is disposed in a state of being attached onto the support 12 in the vacuum chamber 10 which is electrically insulated, and low-temperature plasma is uniformly distributed along the cylinder axis around which the workpiece 11 is disposed.

The cylindrical workpiece 11 is received in the housing 15 and thus isolated from plasma.

The housing 15 includes the slot part 14 functioning as an extracting electrode, in which the slot part 14 is disposed along the surface of the cylindrical workpiece 11 at a predetermined distance from the workpiece 11.

Furthermore, a negative potential sufficient to induce sputtering is applied to the workpiece 11 and the housing 15 which are electrically connected to each other.

Accordingly, ions emitted from plasma are accelerated within a sheath formed between the extracting electrode and plasma, pass through the slot part 14 to thus form ribbon beams in the space between the workpiece 11 and the extracting electrode, and then bombard the cylindrical workpiece 11 within the tilted angle range preset to achieve surface smoothing of the workpiece 11.

Figure 12:
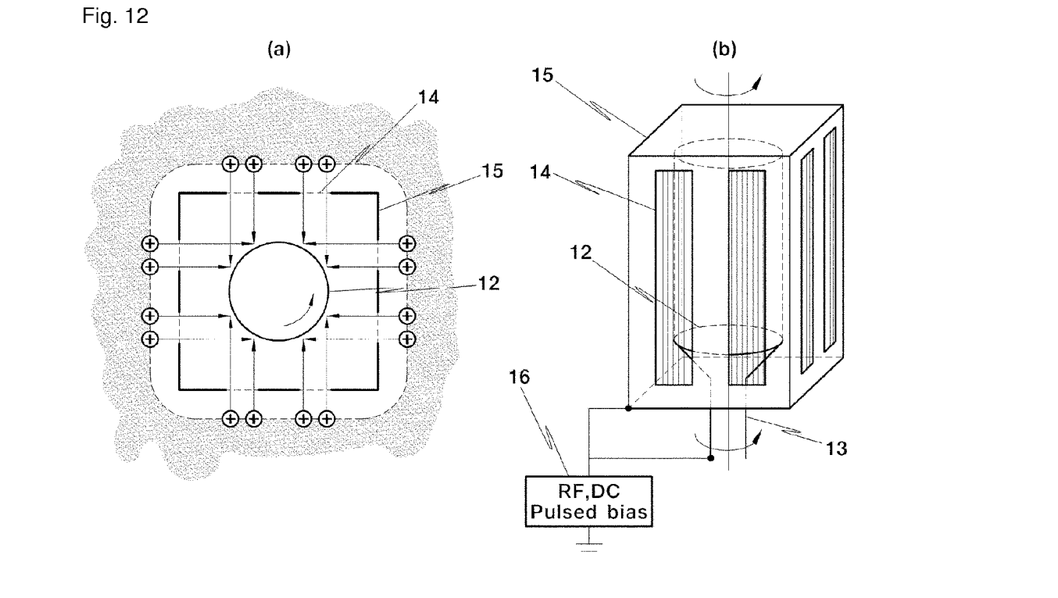
FIG. 12 is a schematic view showing a plasma immersion ion milling apparatus including an electrode arrangement provided on a workpiece housing, according to yet another embodiment of the present invention.

For example, as shown in FIG. 12, the width of the slot part 14 is not set to be the same as the diameter of the workpiece 11 but is set to be narrow. Furthermore, the position of the slot part 14 is set toward the outer surface of the workpiece 11 so that ions bombard only a predetermined portion of the workpiece 11, thus limiting the angle of incidence of ions that reach the surface of the cylinder at any position of the cylinder.

Figure 19:
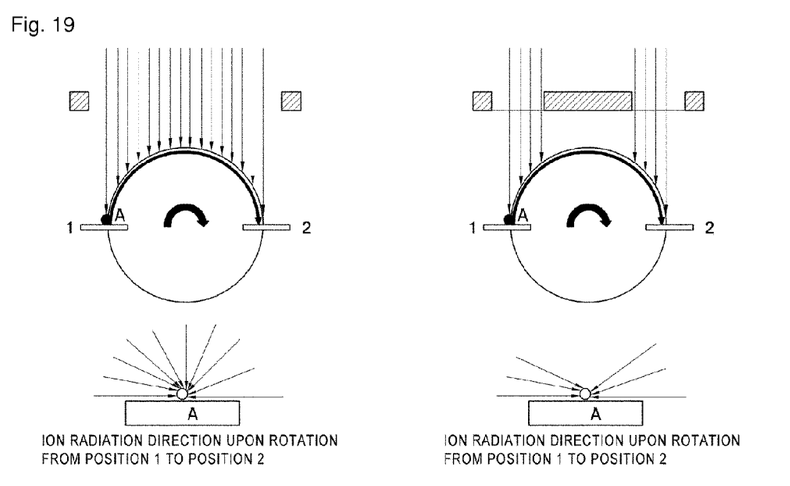
FIG. 19 is a schematic view showing ion bombardment in relation to the width and position of a slot part.

As shown in FIG. 19, depending on the width and position of the slot part 14, ions may travel not in a direction perpendicular to the workpiece but in a lateral direction of the workpiece and thus bombard the workpiece 11, so that the protruding portion of the workpiece 11 may be selectively removed.

The electrical bias may include DC, unipolar or bipolar pulse, or RF bias.

Typical plasma immersion ion milling using relative rotation of the workpiece 11 and the extracting electrode enables the surface of the cylindrical workpiece 11 to be uniformly processed.

Although the configuration in which the workpiece rotates is illustrated in the present invention, a configuration in which the workpiece is fixed and the housing rotates is possible.

Also, sputtering is physically carried out when plasma is formed from an inert gas such as argon or from a reactive gas.

Furthermore, sputtering may be applied to conductive or non-conductive cylindrical workpieces. As such, the workpiece may be processed to a diameter of about 1~40 cm, and a length of about 10~200 cm.

Below, various embodiments of the present invention are specified while making reference to the accompanying drawings.

Figure 4:
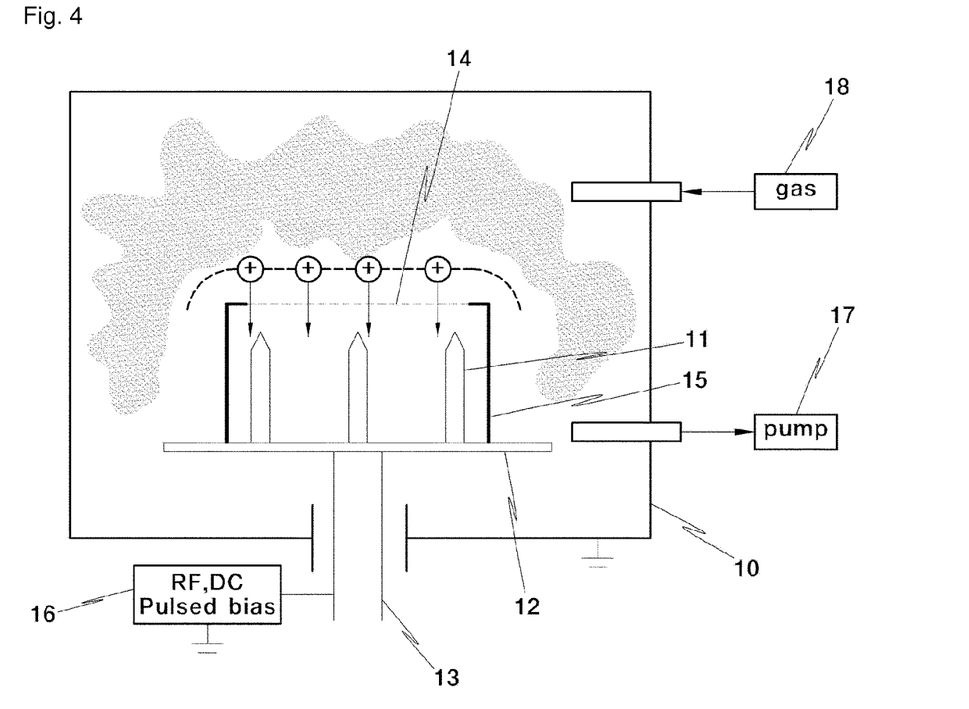
FIG. 4 is a schematic view showing a plasma immersion ion milling apparatus for the processing of workpieces having pointed tips, according to the present invention.

FIG. 4 shows a plasma immersion ion milling apparatus for the processing of workpieces 11 having pointed tips using gridded plasma immersion ion implantation and deposition (PI3D).

Figure 5:
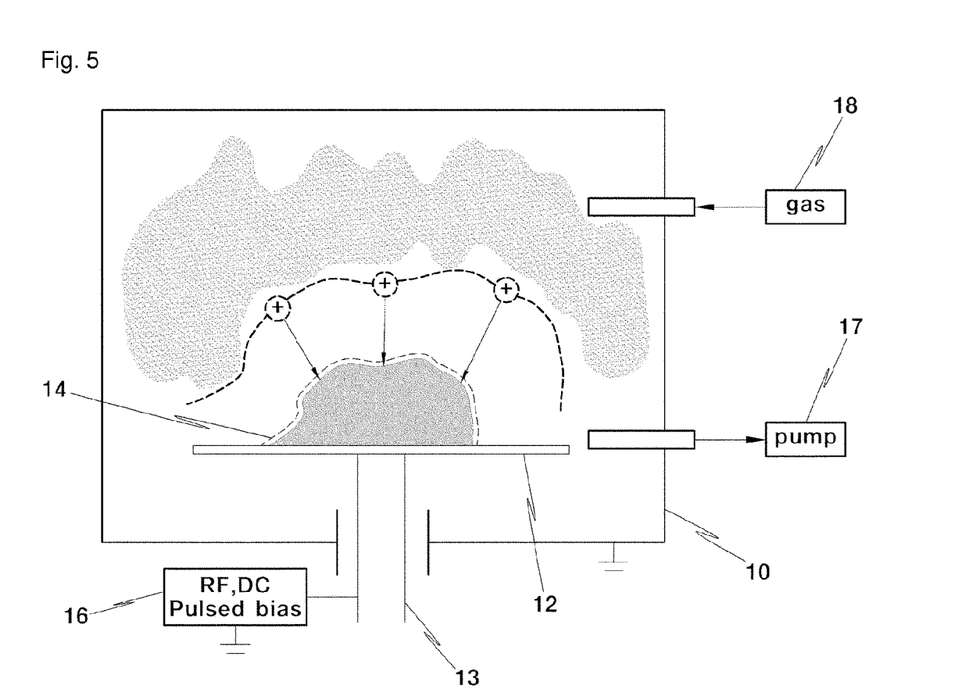
FIG. 5 is a schematic view showing a plasma immersion ion milling apparatus for the processing of a 3D thick dielectric workpiece, according to the present invention.

For example, when processing the workpiece shown in FIGS. 4 and 5, a gridded pattern is more effective than a slot pattern.

FIG. 5 shows a plasma immersion ion milling apparatus for the processing of a 3D thick dielectric workpiece 11 using gridded PI3D.

Figure 6:
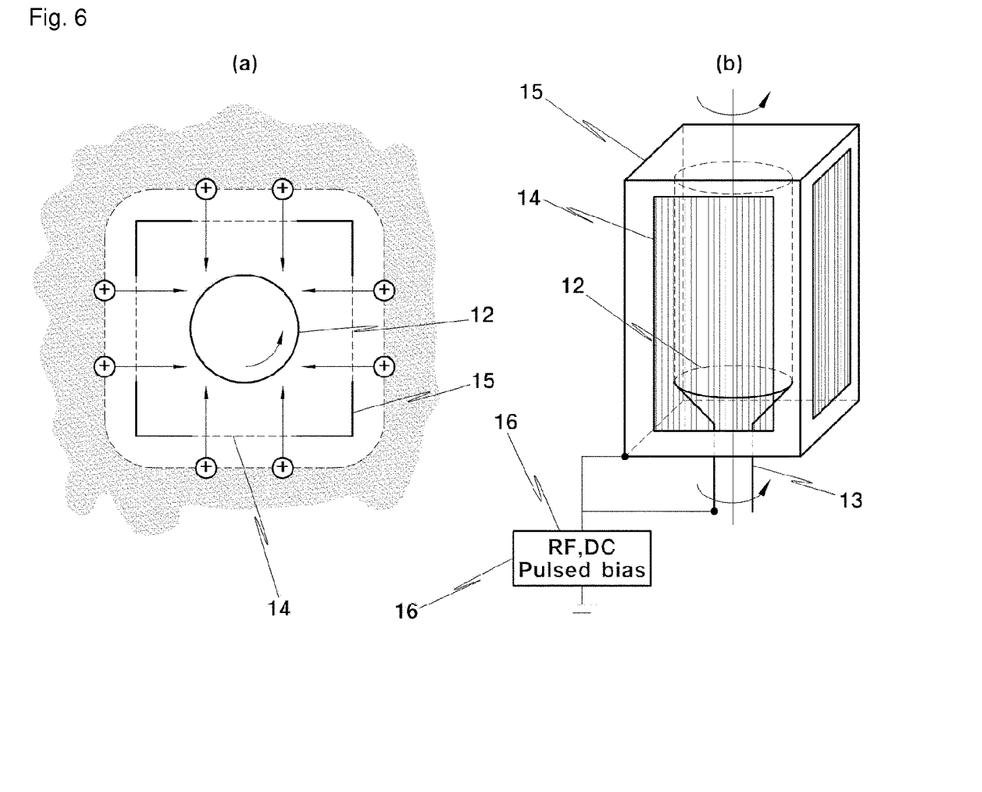
FIG. 6 is of schematic views showing a plasma immersion ion milling apparatus for surface smoothing of a cylindrical workpiece, according to the present invention.

FIG. 6 shows a plasma immersion ion milling apparatus for surface smoothing of a cylindrical workpiece 11.

As such, a housing 15 which is electrically connected to the workpiece 11 and encloses the workpiece 11 has a rectangular cross-section, and a multi-slot part 14, namely an extracting electrode is provided on four sides thereof.

The width of the slot part 14 is the same as the diameter of the workpiece 11, and the length of the slot part 14 is the same as the length of the workpiece 11.

Figure 7:
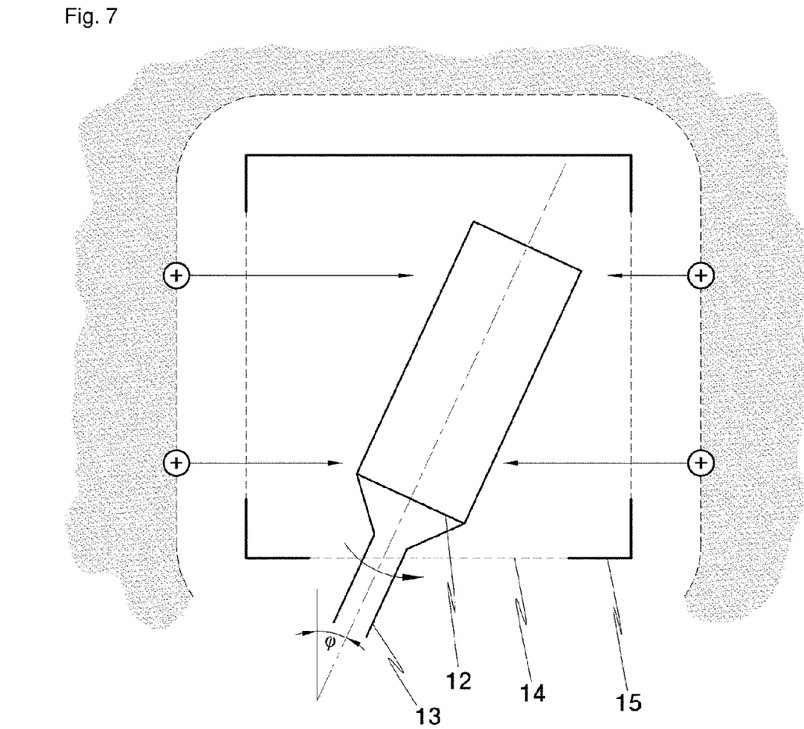
FIG. 7 is a schematic view showing a plasma immersion ion milling apparatus for surface smoothing of a cylindrical workpiece at a predetermined angle, according to the present invention.

FIG. 7 shows surface smoothing of a cylindrical workpiece 11, similar to the presentation of plasma immersion ion milling in FIG. 6.

The axis of the cylindrical workpiece 11 is tilted at a predetermined angle relative to the housing 15 enclosing the workpiece.

Figure 8:
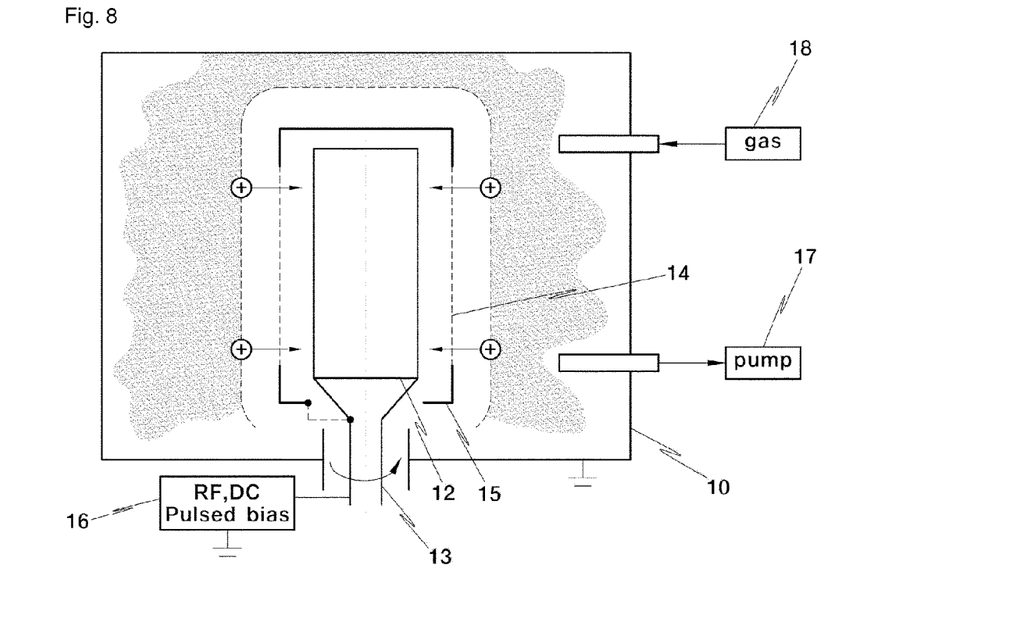
FIG. 8 is a schematic view showing a plasma immersion ion milling apparatus including the configuration of FIG. 6, according to an embodiment of the present invention.

FIG. 8 shows a plasma immersion ion milling apparatus including the configuration of FIG. 6, according to an embodiment of the present invention.

Figure 9:
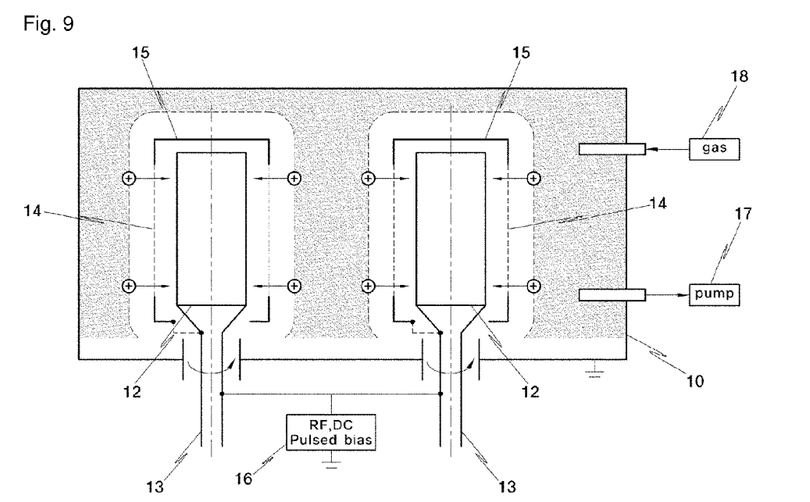
FIG. 9 is a schematic view showing a plasma immersion ion milling apparatus including the configuration of FIG. 6 and batch processing of two cylindrical workpieces, according to another embodiment of the present invention.

FIG. 9 shows a plasma immersion ion milling apparatus including the configuration of FIG. 6 and batch processing of two cylindrical workpieces 11 connected in parallel, according to another embodiment of the present invention.

Figure 10:
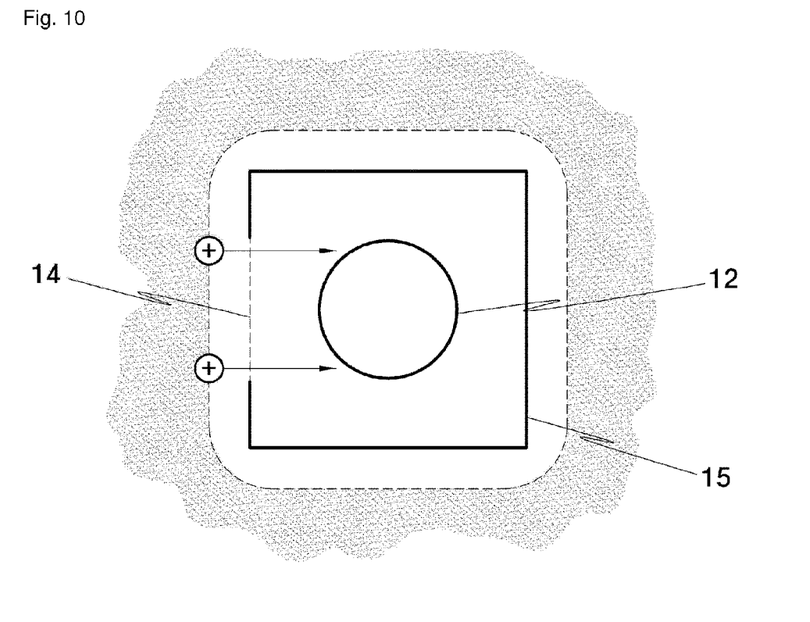
FIG. 10 is a schematic view showing a plasma immersion ion milling apparatus wherein a gridded electrode is attached to only one side of a workpiece housing, according to a further embodiment of the present invention.

FIG. 10 shows a plasma immersion ion milling apparatus, in which a housing 15 enclosing a workpiece 11 has a rectangular cross-section, and an extracting electrode in multi-slot form, namely, a slot part 14 is provided on only one side of four sides of the housing 15, and the width of the slot part 14 is the same as the diameter of the cylindrical workpiece 11, according to a further embodiment of the present invention.

Figure 11:
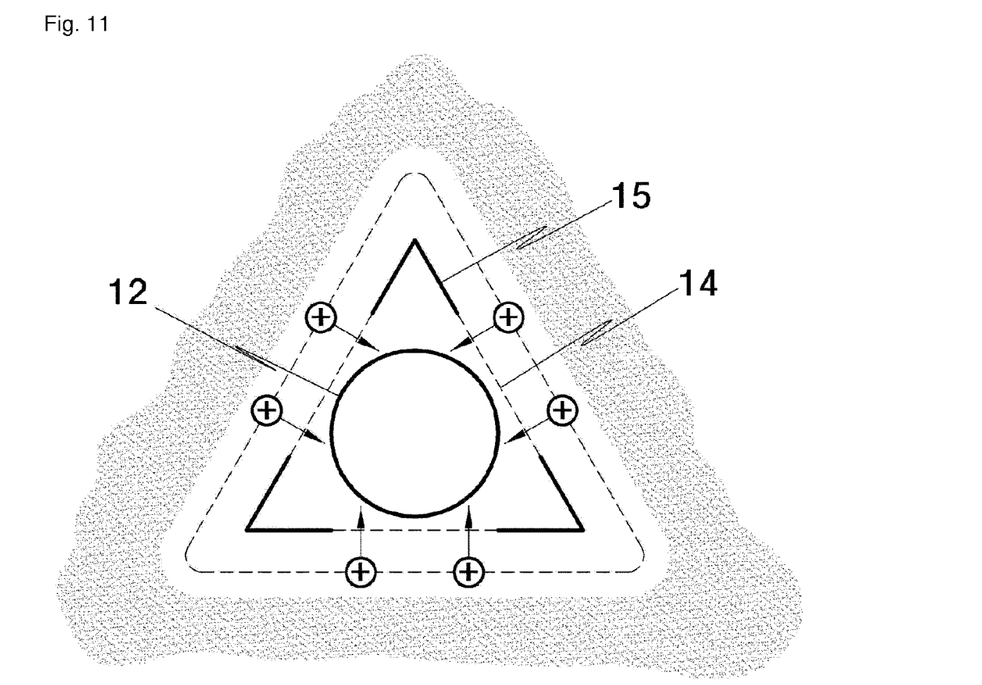
FIG. 11 is a schematic view showing a plasma immersion ion milling apparatus including a workpiece housing having a triangular cross-section, according to yet another embodiment of the present invention.

FIG. 11 shows a plasma immersion ion milling apparatus, in which a housing 15 enclosing a workpiece 11 has a triangular cross-section, and a multi-slot part 14 is provided on three sides of the housing 15, the width of the slot part 14 being the same as the diameter of the cylindrical workpiece 11, according to yet another embodiment of the present invention.

FIG. 12 shows a plasma immersion ion milling apparatus, in which a housing 15 enclosing a workpiece 11 has a rectangular cross-section, and has two multi-slot parts 14 formed on each of four sides thereof, according to yet another embodiment of the present invention.

As such, the slot part 14 is located to form angles at which impinging ions are able to be glancingly incident on the surface of the workpiece 11.

Figure 13:
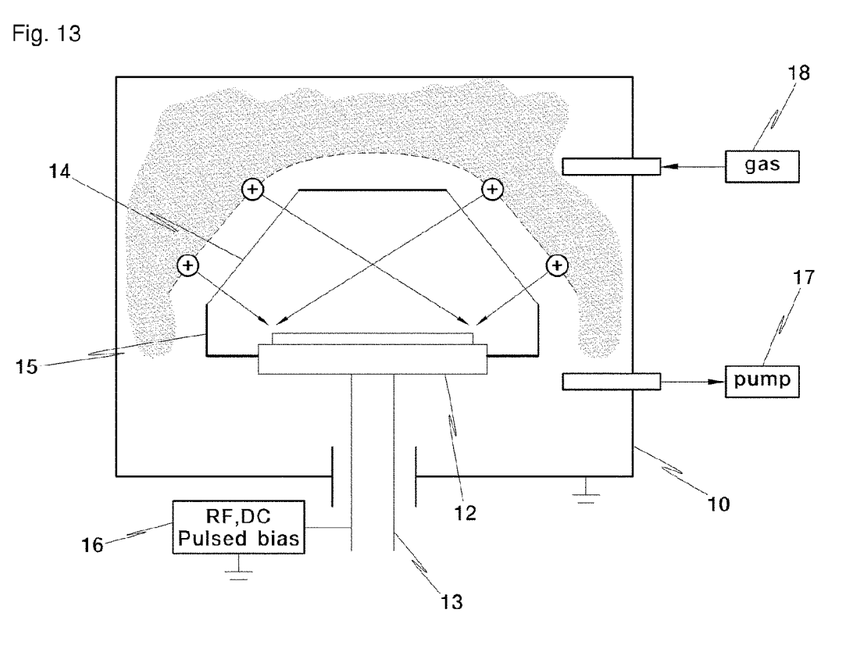
FIG. 13 is a schematic view showing a plasma immersion ion milling apparatus for surface smoothing of a planar workpiece, according to yet another embodiment of the present invention.

FIG. 13 shows a plasma immersion ion milling apparatus for the processing of a planar workpiece 11, according to yet another embodiment of the present invention.

The extracting electrode, namely, the slot part 14, of the housing 15 has a taper grid so as to generate ion bombardment from every direction at the inclined incidence.

Figure 14:
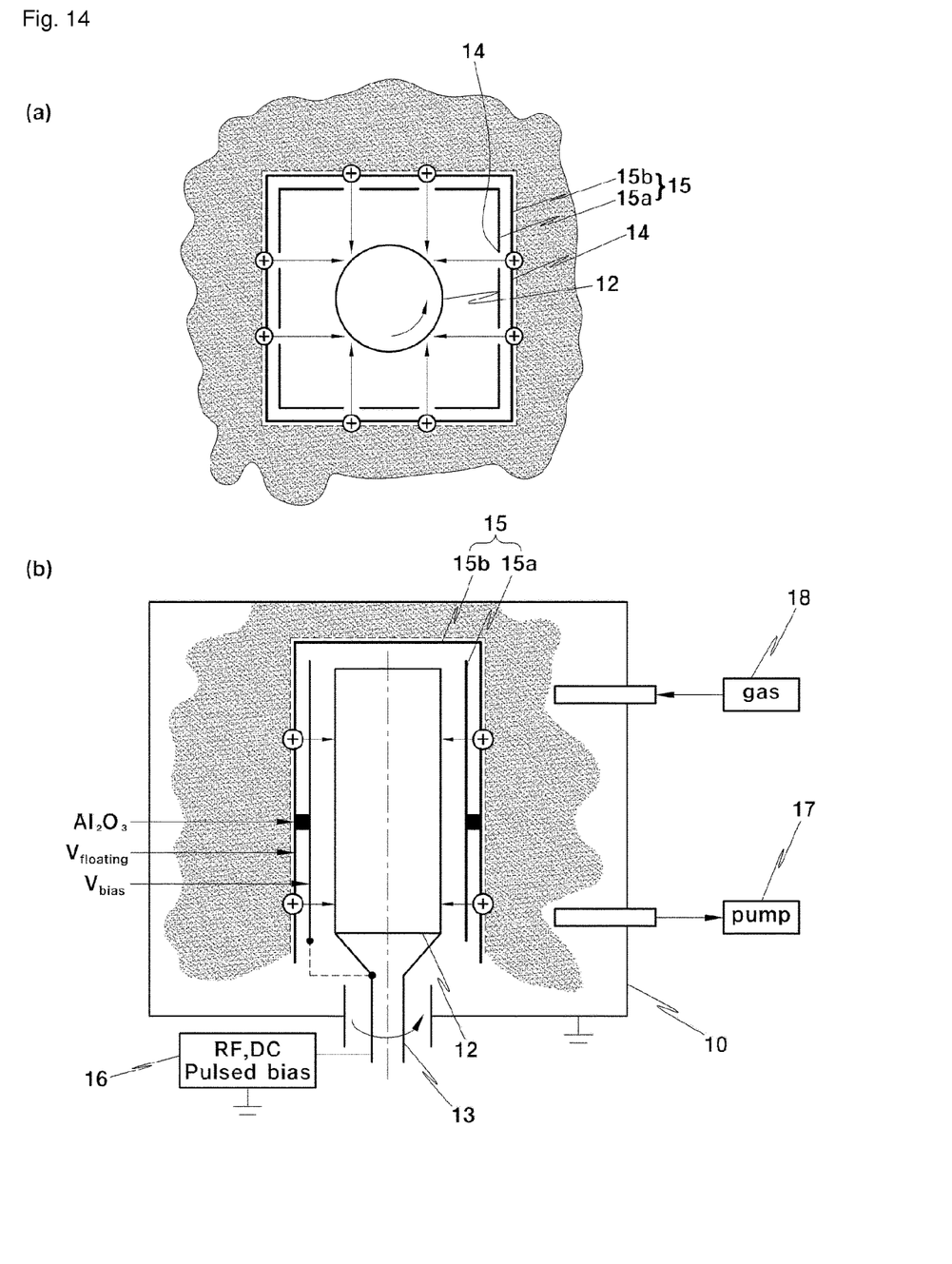
FIG. 14 is of schematic views showing a plasma immersion ion milling apparatus including a double workpiece housing, according to yet another embodiment of the present invention.

FIG. 14 shows a double workpiece housing 15, according to yet another embodiment of the present invention.

The housing 15 enclosing the workpiece 11 includes an inner housing 15a and an outer housing 15b spaced apart from each other by a predetermined gap, in which the inner housing 15a that is conductive is connected to the workpiece 11 and the outer housing 15b is floating or grounded.

In order to more effectively use the milling apparatus according to the present invention, the outer housing is preferably in a floating state. When it is difficult to maintain the floating state during the process, the grounded state may be adopted.

Respective sides of the inner housing 15a and the outer housing 15b having a rectangular cross-section include two slot parts 14. As such, respective slot parts 14 may be positioned not toward the center of the workpiece 11 but toward the outer surface thereof.

Depending on the position of the slot part 14, ions which bombard the workpiece 11 may exhibit partially superior polishing properties in a glancing manner after bombardment.

The slot part 14 has a small width so as to cover a portion of the area of the workpiece 11.

Figure 15:
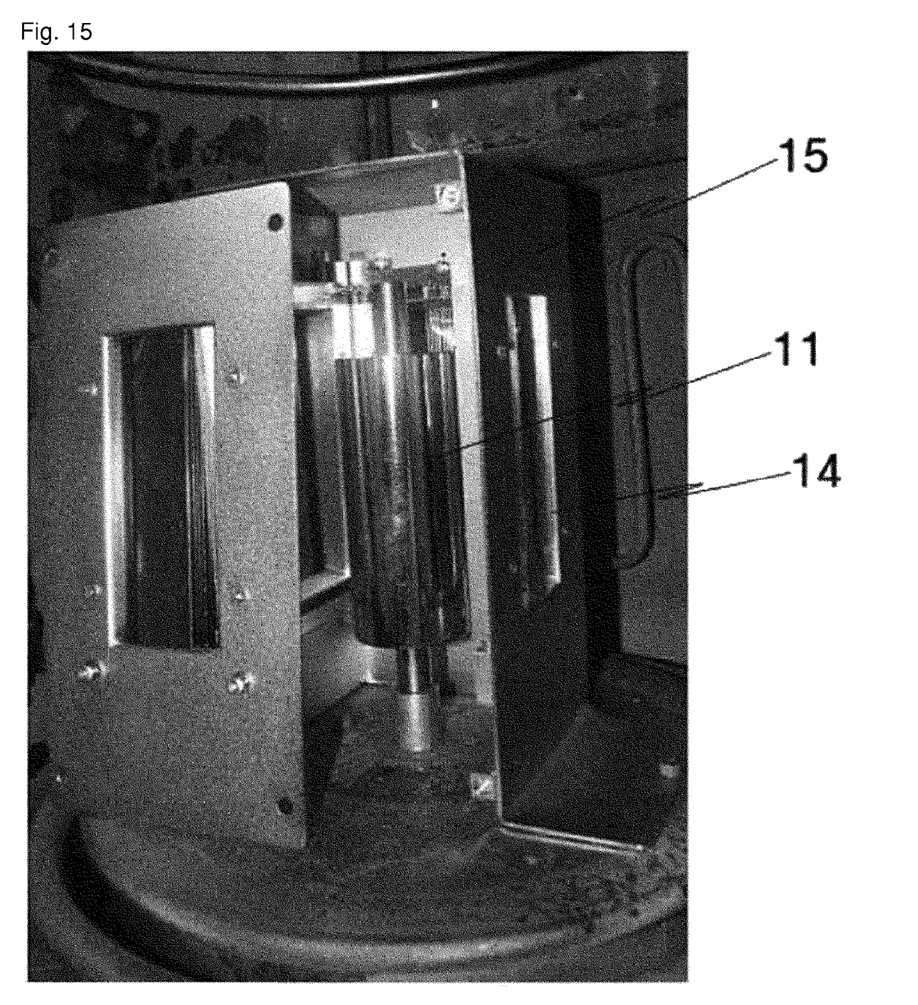
FIG. 15 is a photograph showing an experimental setup which actually embodies the apparatus according to the present invention.

FIG. 15 is a photograph showing an actual experimental setup according to the present invention.

As such, the front grid is seen to be detached.

Figure 16:
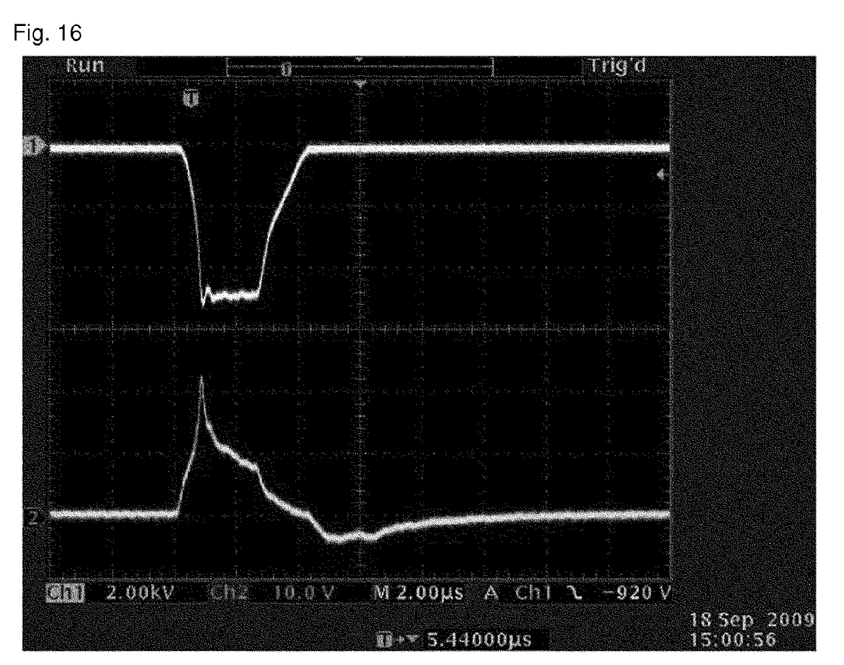
FIG. 16 is a graph showing pulse bias voltage and load current during plasma immersion ion milling using the experimental setup of FIG. 15.

FIG. 16 shows pulse bias voltage and load current during plasma immersion ion milling using the experimental setup of FIG. 15.

Figure 17:
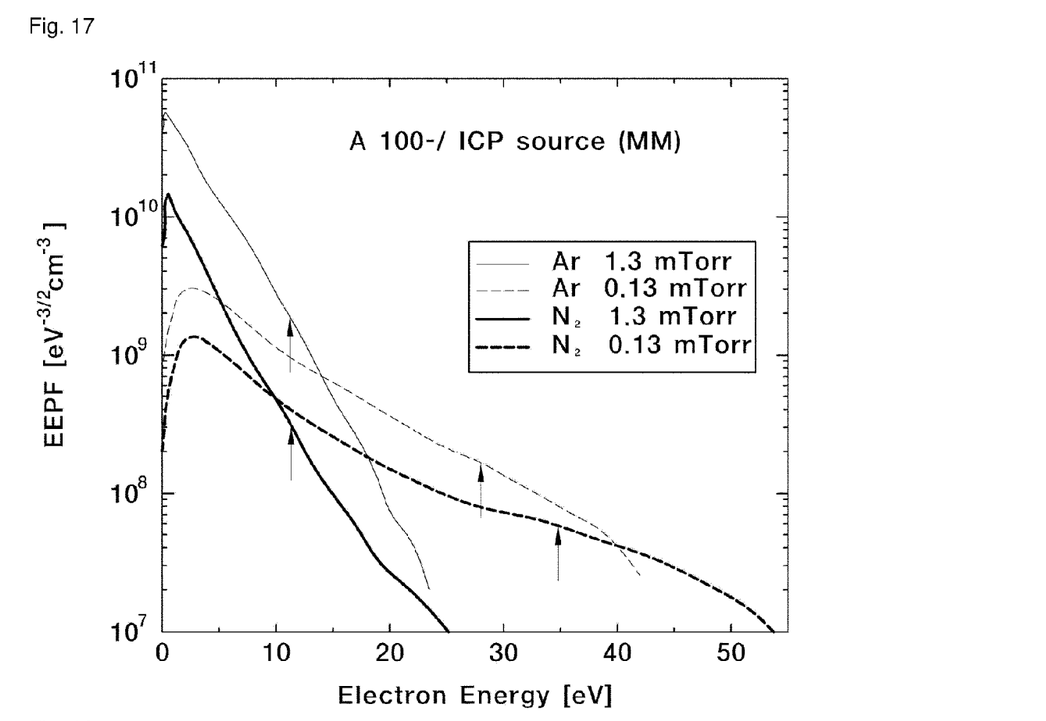
FIG. 17 is a graph showing an electron energy probability function for argon and nitrogen plasma of ICP discharge.

FIG. 17 is a graph showing an electron energy probability function for argon and nitrogen plasma of an ICP discharge.

Figure 18:
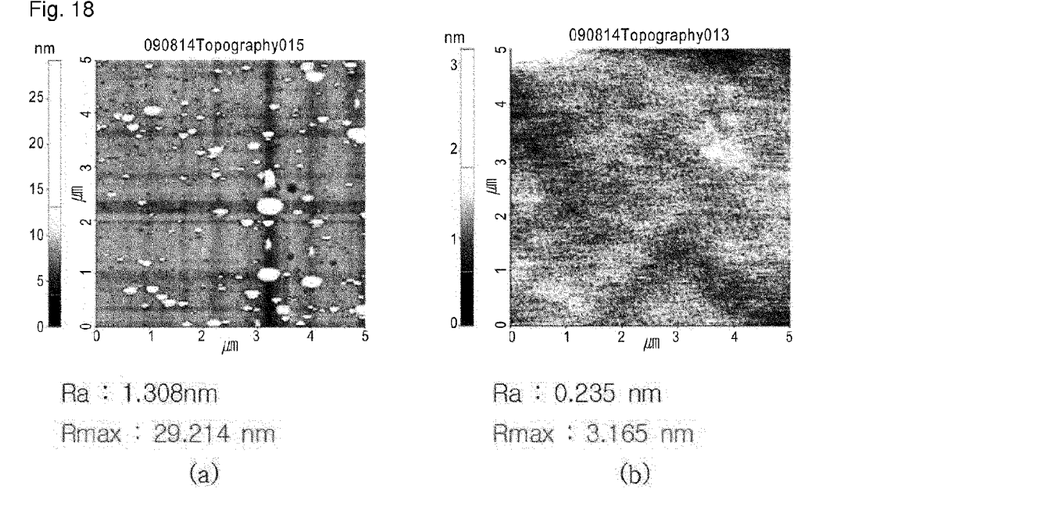
FIG. 18 is of images showing results of the plasma immersion ion milling of a glass sample using the experimental setup of FIG. 15.

FIG. 18 shows plasma immersion ion milling of a glass sample using the experimental setup of FIG. 15, in which (a) shows an AFM image before ion milling and (b) shows an AFM image after ion milling (argon plasma, pulse bias: 2 kV, 2 s, 2 kHz).

In addition, according to the present invention, a plasma immersion ion milling method is described below.

The plasma immersion ion milling method includes applying a bias which is relatively negative compared to a plasma potential to a workpiece 11 and a housing 15 using a power source 16 connected to the workpiece 11 and the housing 15 so that ions accelerated within the sheath formed around the housing are extracted into the space between the housing 15 and the workpiece 11 through the extracting electrode of the housing 15 and thus bombard the rotating workpiece 11 at a preset incident angle, thereby polishing the surface of the cylindrical workpiece 11.

Specifically, disposing the workpiece in the electrically insulated chamber, namely, disposing the workpiece on a rotary support which is electrically insulated from the chamber, is performed first.

Subsequently, enclosing the workpiece with an electrically insulated housing is performed.

As such, the housing is electrically connected to the workpiece and thus functions as an ion extracting electrode with a slot part.

Subsequently, forming plasma in the chamber is performed.

Low-temperature high-density plasma is supplied around the housing, and may be uniformly made depending on the kind of workpiece.

Subsequently, applying a negative bias to the workpiece and the housing and rotating the workpiece are performed.

As such, the bias may include DC, unipolar or bipolar pulse, or RF.

Subsequently, polishing the surface of the workpiece using ion bombardment with a preset incident angle and ion energy is performed.

The ions accelerated within the sheath formed around the housing are extracted into the space between the housing and the workpiece through the extracting electrode and thus bombard the workpiece, thus polishing the surface of the workpiece.

Upon polishing the surface of the workpiece, plasma processing may be applied to conduct surface cleaning, surface activating, dry etching of micro and nano patterned structures, thin film depositing, ion depositing, repetitive etching-depositing, plasma milling based on ion implantation, surface smoothing, and other forms of processing.

Ion beam or plasma processing of a variety of workpieces according to the present invention allows surface smoothing, cleaning, surface activating, etching, thin film depositing, ion implantation, and other surface treatments to be carried out. The method according to the present invention may be applied to micro and nano pattern transferring techniques, and to the production of semiconductor devices or flat panel displays.

The invention claimed is:

1. A plasma immersion ion milling apparatus, comprising:
a vacuum chamber which is electrically insulated and in which plasma is distributed;
a rotary support on which a workpiece having a cylindrical shape is placed and which is disposed in the vacuum chamber;
a rotating element which is disposed in the vacuum chamber to rotate the rotary support;
a housing including a slot part disposed along a surface of a workpiece on at least one side thereof, being conductive, enclosing the workpiece to isolate the workpiece from plasma, and electrically connected to the workpiece; and
a power source for supplying power to the workpiece and the housing,
wherein a bias which is negative compared to a plasma potential is applied to the workpiece and the housing, the housing functions as an extracting electrode with the slot part, and ions accelerated within a sheath formed around the housing are extracted into a space between the housing and the workpiece through the slot part of the housing and thus bombard the workpiece that is rotating, thereby polishing the surface of the workpiece,
wherein the housing has a rectangular cross-section with two slot parts on each of four sides thereof so that impinging ions are glancingly incident on the cylindrical surface of the workpiece, and
wherein the slot part is positioned such that ions passing through the slot part bombard the workpiece directly and is positioned toward the outside portion of the cylindrical surface of the workpiece, the outside portion being opposite to the housing surface having two slot formed thereon.

2. The apparatus according to claim 1, wherein the workpiece is tilted at a predetermined angle relative to the housing.

3. The apparatus according to claim 1, wherein the housing includes an inner housing and an outer housing spaced apart from each other by a predetermined gap, in which the inner housing is conductive and is connected to the workpiece, and the outer housing is floating or grounded.

4. The apparatus according to claim 1, wherein the bias is any one selected from among an RF self bias, a unipolar repetitive pulsed bias, and a bipolar repetitive pulsed bias.

5. The apparatus according to claim 1, wherein the plasma is formed using any one selected from among an interior antenna ICP source, an inert gas, and a reactive gas.

6. The apparatus according to claim 1, wherein two sets of the support, the rotating element and the housing are provided, and disposed side by side in a single vacuum chamber.

7. A plasma immersion ion milling apparatus, comprising:
a vacuum chamber which is electrically insulated and in which plasma is distributed;
a support on which a workpiece having a cylindrical shape is placed and disposed in the vacuum chamber;

a housing including a slot part disposed along a surface of a workpiece on at least one side thereof, being conductive, enclosing the workpiece to isolate the workpiece from plasma, electrically connected to the workpiece, and being rotary;

a rotating element for rotating the housing; and a power source for supplying power to the workpiece and the housing, wherein a bias which is negative compared to a plasma potential is applied to the workpiece and the housing, the housing functions as an extracting electrode with the slot part and rotates, and ions accelerated within a sheath formed around the housing are extracted into a space between the housing and the workpiece through the slot part of the housing and thus bombard the workpiece, thereby polishing the surface of the workpiece, wherein the housing has a rectangular cross-section with two slot parts on each of four sides thereof so that impinging ions are glancingly incident on the cylindrical surface of the workpiece, and wherein the slot part is positioned such that ions passing through the slot part bombard the workpiece directly and is positioned toward the outside portion of the cylindrical surface of the workpiece, the outside portion being opposite to the housing surface having two slot formed thereon.

8. A plasma immersion ion milling method, comprising:

disposing, in an electrically insulated vacuum chamber, a workpiece having a cylindrical shape on a rotary support electrically insulated from the chamber;

enclosing the workpiece with a housing which is electrically connected to the workpiece and functions as an ion extracting electrode with a slot part;

forming plasma in the chamber;

applying a negative bias to the workpiece and the housing and rotating the workpiece; and extracting ions, which were accelerated within a sheath formed around the housing, into a space between the housing and the workpiece through the slot part of the housing so as to bombard the workpiece, thus polishing a surface of the workpiece, wherein the housing has a rectangular cross-section with two slot parts on each of four sides thereof so that impinging ions are glancingly incident on the cylindrical surface of the workpiece, and wherein the slot part is positioned such that ions passing through the slot part bombard the workpiece directly and is positioned toward the outside portion of the cylindrical surface of the workpiece, the outside portion being opposite to the housing surface having two slot formed thereon.

9. The method according to claim 8, wherein the housing includes an inner housing and an outer housing spaced apart from each other by a predetermined gap, in which the inner housing is conductive and is connected to the workpiece, and the outer housing is floating or grounded.

10. The method according to claim 8, wherein the polishing the surface of the workpiece comprises any one selected from among surface cleaning, surface activating, dry etching of micro and nano patterned structures, thin film depositing, ion depositing, repetitive etching-depositing, plasma milling based on ion implantation, and surface smoothing.

* * * * *